(12) United States Patent
Van Der Heijden et al.

(10) Patent No.: US 7,812,675 B2
(45) Date of Patent: Oct. 12, 2010

(54) RECEIVER COMPRISING AN AMPLIFIER

(75) Inventors: Edwin Van Der Heijden, Eindhoven (NL); Hugo Veenstra, Kleine Brogel (BE)

(73) Assignee: ST-Ericsson SA, Geneva (CH)

( * ) Notice: Subject to any disclaimer, the term of this patent is extended or adjusted under 35 U.S.C. 154(b) by 163 days.

(21) Appl. No.: 11/815,965

(22) PCT Filed: Jan. 30, 2006

(86) PCT No.: PCT/IB2006/050320

§ 371 (c)(1),
(2), (4) Date: Jun. 27, 2008

(87) PCT Pub. No.: WO2006/085238

PCT Pub. Date: Aug. 17, 2006

(65) Prior Publication Data

US 2009/0115515 A1    May 7, 2009

(30) Foreign Application Priority Data

Feb. 9, 2005    (EP) .................................. 05100906

(51) Int. Cl.
*H03F 3/04*    (2006.01)
(52) U.S. Cl. ...................................... 330/301; 330/117
(58) Field of Classification Search .................. 330/301, 330/117, 116
See application file for complete search history.

(56) References Cited

U.S. PATENT DOCUMENTS

| | | | |
|---|---|---|---|
| 6,057,714 A * | 5/2000 | Andrys et al. ................ 327/105 |
| 6,259,325 B1 | 7/2001 | Ishizuka et al. | |
| 6,441,688 B1 * | 8/2002 | Lau et al. ..................... 330/301 |
| 6,559,723 B2 * | 5/2003 | Hollenbeck et al. ......... 330/301 |
| 6,819,182 B2 * | 11/2004 | Sibrai ........................ 330/288 |
| 2002/0187768 A1 | 12/2002 | Lin | |
| 2003/0042983 A1 | 3/2003 | Hollenbeck et al. | |
| 2003/0197575 A1 | 10/2003 | Rofougaran et al. | |
| 2007/0205829 A1 * | 9/2007 | Kao et al. .................... 330/301 |

FOREIGN PATENT DOCUMENTS

| | | |
|---|---|---|
| EP | 0472340 A1 | 2/1992 |
| WO | 2006085238 A1 | 8/2006 |

* cited by examiner

*Primary Examiner*—Henry K Choe

(57) ABSTRACT

The invention relates to a receiver (1) comprising an amplifier (31-34) for amplifying an antenna signal, which amplifier (31-34) comprises an amplifier input (11a) and an amplifier output (12a,12b), the amplifier input (11a) being a single ended input for receiving the antenna signal, the amplifier output (12a, 12b) being a differential output, and the amplifier (31-34) comprising circuit (41,42) for reducing a common mode input impedance of the amplifier (31-34).

16 Claims, 3 Drawing Sheets

RECEIVER COMPRISING AN AMPLIFIER

This patent application is related to application Ser. No. 11/815,966 in that both share a common owner, the same inventors, and the same priority, international, and US filing dates.

The invention relates to a receiver comprising an amplifier, and also relates to an amplifier, and to a method.

Examples of such a receiver are wireless receivers, wireless transceivers and wireless interfaces.

A prior art receiver is known from US 2003/0042983 A1, which discloses a receiver comprising an amplifier for amplifying a radio frequency signal (an antenna signal). The amplifier comprises two transistors and an amplifier input and an amplifier output. First main electrodes of the two transistors constitute the amplifier input and second main electrodes of the two transistors constitute the amplifier output. This amplifier input is a differential input and this amplifier output is a differential output.

To couple a single ended antenna to a differential input, a balun must be used. Such a balun requires, when being on chip, relatively much chip area, and results in signal losses and increased noise figures. To avoid such a balun, only one of the first main electrodes is to be used as an amplifier input. This amplifier input is then a single ended input for receiving the antenna signal. Owing to the fact that the amplifier input is used as a single ended input, there will be some impedance mismatching, which results in signal losses. To reduce the impedance mismatching, an impedance matching resistor had to be introduced. This impedance matching resistor, which adds relatively much noise, is located in parallel to one of two inductors coupled in serial to the first main electrodes of the two transistors.

The known receiver is disadvantageous, inter alia, owing to the fact that the level of the noise figure of the amplifier is relatively high.

It is an object of the invention, inter alia, to provide a receiver comprising an amplifier with a single ended input and a differential output and having a noise figure at a relatively low level while simultaneously providing an input power match.

The receiver according to the invention comprises an amplifier for amplifying an antenna signal, which amplifier comprises an amplifier input and an amplifier output, the amplifier input being a single ended input for receiving the antenna signal, the amplifier output being a differential output, and the amplifier comprising circuit a for reducing a common mode input impedance of the amplifier.

By introducing the circuit for reducing a common mode input impedance of the amplifier, the input impedance of the amplifier is balanced without needing to introduce a noise generating resistor. As a result, the noise figure of the amplifier is at a relatively low and acceptable level.

An embodiment of the receiver according to the invention is defined by the amplifier comprising a first transistor and a second transistor, control electrodes of both transistors being coupled to each other via a first element, first main electrodes of both transistors being coupled to each other via a second element, and the means comprising the first element. These first and second transistors form a first transistor stage such as for example a common emitter stage. Such a transistor stage has a better amplification than the stage disclosed in US 2003/0042983 A1. The second element for example comprises a differential inductor with a center tap or two serial inductors, just like the ones described in US 2003/0042983 A1. One of these serial inductors described in US 2003/0042983 A1 must have a relatively large value, which makes it difficult to realize this inductor on chip. The differential inductor with a center tap or the two serial inductors together forming the second element will have smaller values and can easily be realized on chip.

An embodiment of the receiver according to the invention is defined by the first element comprising a differential inductor with a center tap and having a coupling factor k, with $0.5 \leq k \leq 1.0$. For $0.5 \leq k \leq 1.0$, the differential inductor with a center tap will reduce the common mode input impedance to obtain an input power match while providing a single ended input. Preferably, $0.8 \leq k \leq 1.0$, and for k=1, the differential inductor with a center tap will minimize the common mode input impedance. Other means for reducing the common mode input impedance of the amplifier are not to be excluded.

An embodiment of the receiver according to the invention is defined by the center tap being coupled to a voltage source. This is done for biasing purposes.

An embodiment of the receiver according to the invention is defined by second main electrodes of both transistors being coupled to a cascode circuit comprising the amplifier output. The cascode circuit comprises further transistors and forms a second transistor stage such as a common base stage.

An embodiment of the receiver according to the invention is defined by a control electrode of the first transistor being coupled via a first capacitor to the amplifier input, and a control electrode of the second transistor being coupled via a second capacitor to ground. The function of this first capacitor has been shifted from a prior art location in a prior art impedance matching network to its present location. The function of this second capacitor has been shifted from a prior art location in the prior art impedance matching network to its present location. This prior art impedance matching network is for example located between the antenna and a prior art amplifier having a differential input.

The function of the differential inductor with a center tap has been shifted from a prior art location in the prior art impedance matching network to its present location. The coupling factor k, with $0.5 \leq k \leq 1.0$, which coupling factor was irrelevant in the prior art impedance matching network, is responsible for the reduction of the common mode input impedance.

An embodiment of the receiver according to the invention is defined by both capacitors having different values. Especially for both capacitors having different values according to a fixed relationship, which was not present in the prior art impedance matching network, the amplifier will perform well.

Embodiments of the amplifier according to the invention and of the method according to the invention correspond with the embodiments of the receiver according to the invention.

The invention is based upon an insight, inter alia, that the level of the noise figure of the prior art amplifier is relatively high. The invention is based upon a basic idea, inter alia, that means for reducing a common mode input impedance of the amplifier are to be introduced.

The invention solves the problem, inter alia, to provide a receiver comprising an amplifier with a single ended input and a differential output and having a noise figure at a relatively low level while simultaneously providing an input power match. The invention is advantageous, inter alia, in that the noise figure of the amplifier is at a relatively low and acceptable level.

These and other aspects of the invention will be apparent from and elucidated with reference to the embodiments(s) described hereinafter.

Figure 1:
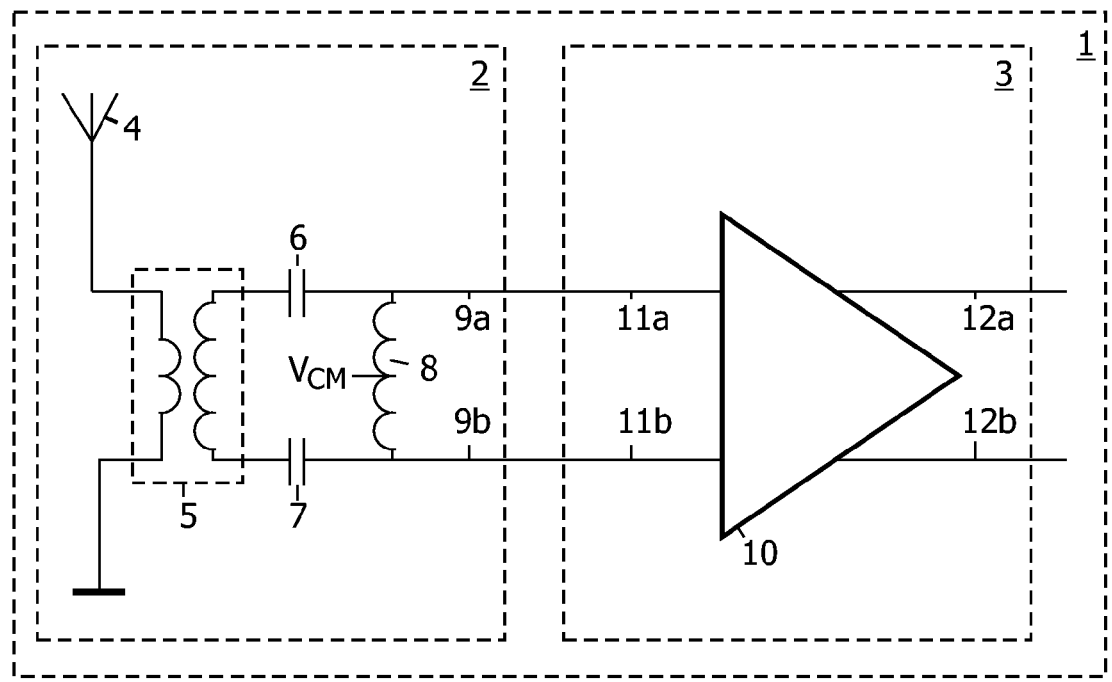
FIG. 1 shows diagrammatically a prior art receiver comprising a prior art amplifier.

The prior art receiver 1 shown diagrammatically in FIG. 1 comprises a prior art antenna stage 2 and a prior art amplifying stage 3. The prior art antenna stage 2 comprises an antenna 4 coupled to ground via one side of a balun 5. The other side of the balun 5 is coupled via capacitors 6 and 7 to an antenna stage output. This antenna stage output 9a,9b comprises a differential output. The ports 9a and 9b are mutually coupled via an inductor 8 having a center tap coupled to a bias voltage $V_{CM}$. The capacitors 6 and 7 and the inductor 8 together form a prior art impedance matching network.

The prior art amplifying stage 3 comprises a prior art low noise amplifier 10 comprising an amplifier input 11a,11b and an amplifier output 12a,12b. The amplifier input 11a,11b comprises a differential input comprising the ports 11a and 11b, and the amplifier output 12a,12b comprises a differential output comprising the ports 12a and 12b.

Figure 2:
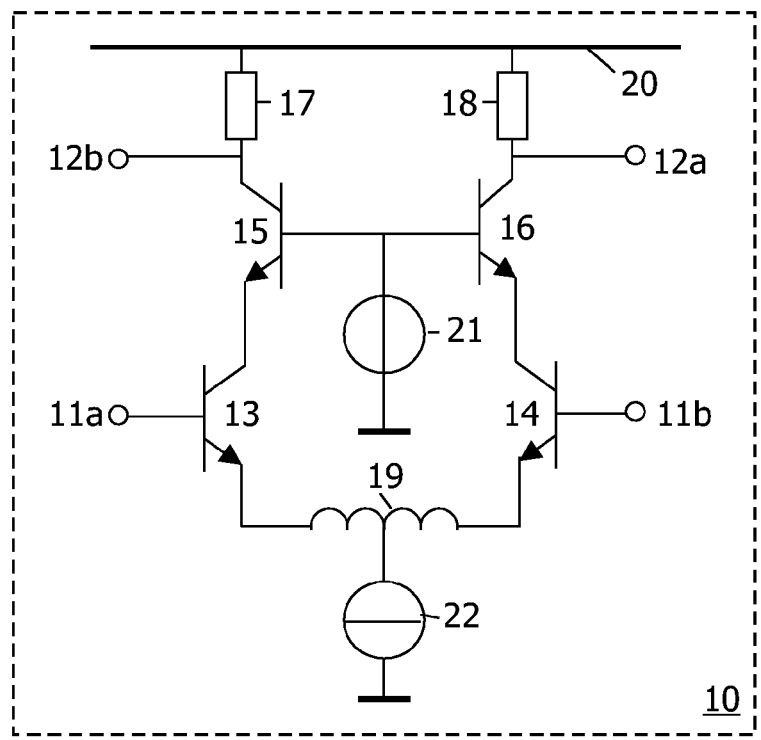
FIG. 2 shows diagrammatically a prior art amplifier in greater detail comprising a differential input and a differential output.

The prior art amplifying stage 3 comprising the prior art low noise amplifier 10 shown diagrammatically in FIG. 2 in greater detail comprises two transistors 13 and 14 of which the control electrodes (bases) form the ports 11a and 11b and of which first the main electrodes (emitters) are coupled to each other via a differential inductor with a center tap 19 or two serial inductors. The center tap of the differential inductor 19 or the common point of the two serial inductors is coupled via a current source 22 to ground. The second main electrodes (collectors) of the transistors 13 and 14 are coupled to first main electrodes (emitters) of transistors 15 and 16, of which the control electrodes (bases) are coupled to each other and via a voltage source 21 to ground. Second main electrodes (collectors) of the transistors 15 and 16 are coupled via resistors 17 and 18 to a voltage supply 20 and form the ports 12b and 12a.

The low noise amplifier 10 shown in the FIGS. 1 and 2 comprises an amplifier input 11a,11b being a differential input. Such a differential input requires a balun 5 to be used in the antenna stage 2. This is a disadvantage. To avoid the balun, an amplifying stage comprising a low noise amplifier with a single ended input and a differential output has been created, for example as follows.

Figure 3:
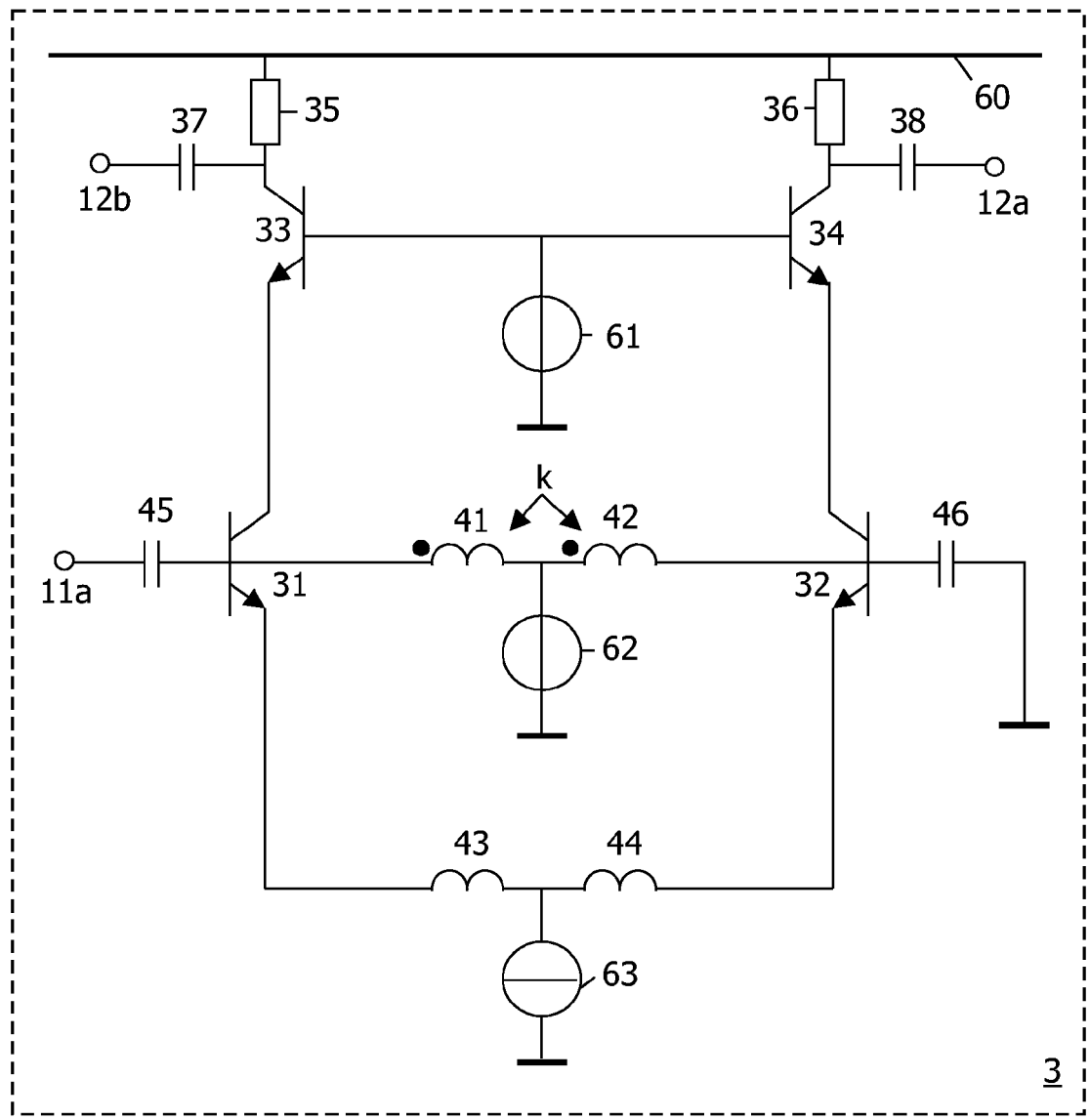
FIG. 3 shows diagrammatically an amplifier according to the invention in greater detail comprising a single ended input and a differential output.

The (low noise) amplifier 31-34 according to the invention shown diagrammatically in FIG. 3 in greater detail comprises a first transistor 31 and a second transistor 32. The control electrodes (bases) of both transistors 31 and 32 are coupled to each other via a first element 41,42. The first main electrodes (emitters) of both transistors 31 and 32 are coupled to each other via a second element 43,44 and the second main electrodes (collectors) of both transistors 31 and 32 are coupled to a cascode circuit 33,34. These first and second transistors 31 and 32 form a first transistor stage such as for example a common emitter stage. The cascode circuit 33,34 comprises further transistors 33 and 34 and forms a second transistor stage such as a common base stage.

The first main electrodes (emitters) of the transistors 33 and 34 are coupled to the second main electrodes (collectors) of the transistors 31 and 32. The control electrodes (bases) of the transistors 33 and 34 are coupled to each other and to a voltage source 61 for biasing purposes. The second main electrodes of the transistors 33 and 34 are coupled via resistors 35 and 36 to a voltage supply 60 and via optional coupling capacitors 37 and 38 to the ports 12b and 12a. The control electrode (base) of the first transistor 31 is coupled via a first capacitor 45 to the port 11a. The control electrode (base) of the second transistor 32 is coupled via a second capacitor 46 to ground. The first element 41,42 comprises a differential inductor 41,42 with a center tap and having a coupling factor k, with $0.5 \leq k \leq 1.0$, preferably $0.8 \leq k \leq 1.0$, more preferably k=1. The center tap of the differential inductor 41,42 is coupled to a voltage source 62 for biasing purposes. The second element 43,44 comprises a differential inductor 43,44 with a center tap or two serial inductors 43 and 44. The center tap of the differential inductor 43,44 or the common point of the serial inductors 43 and 44 is coupled to a current source 63 for biasing purposes.

The functions of the first and second capacitors 45 and 46 have been shifted from their prior art locations in the prior art impedance matching network (capacitors 6 and 7 in FIG. 1) to their present locations. In the prior art impedance network, the capacitors 6 and 7 are coupled to the ports 11a and 11b and will therefore usually have the same value. Owing to the fact that the first capacitor 45 is coupled to the port 11a and the second capacitor 46 is coupled to ground, these first and second capacitors 45 and 46 will usually have different values.

The function of the differential inductor 41,42 has been shifted from a prior art location in the prior art impedance matching network (inductor 8 in FIG. 1) to its present location. By giving the differential inductor 41,42 a coupling factor k, with $0.5 \leq k \leq 1.0$, a common mode impedance of the amplifier 31-34 comprising the function of the inductor 8 is reduced. For k=1, this common mode input impedance of the amplifier 31-34 comprising the function of the inductor 8 is minimized. This will be explained below at the hand of an impedance model.

Figure 4:
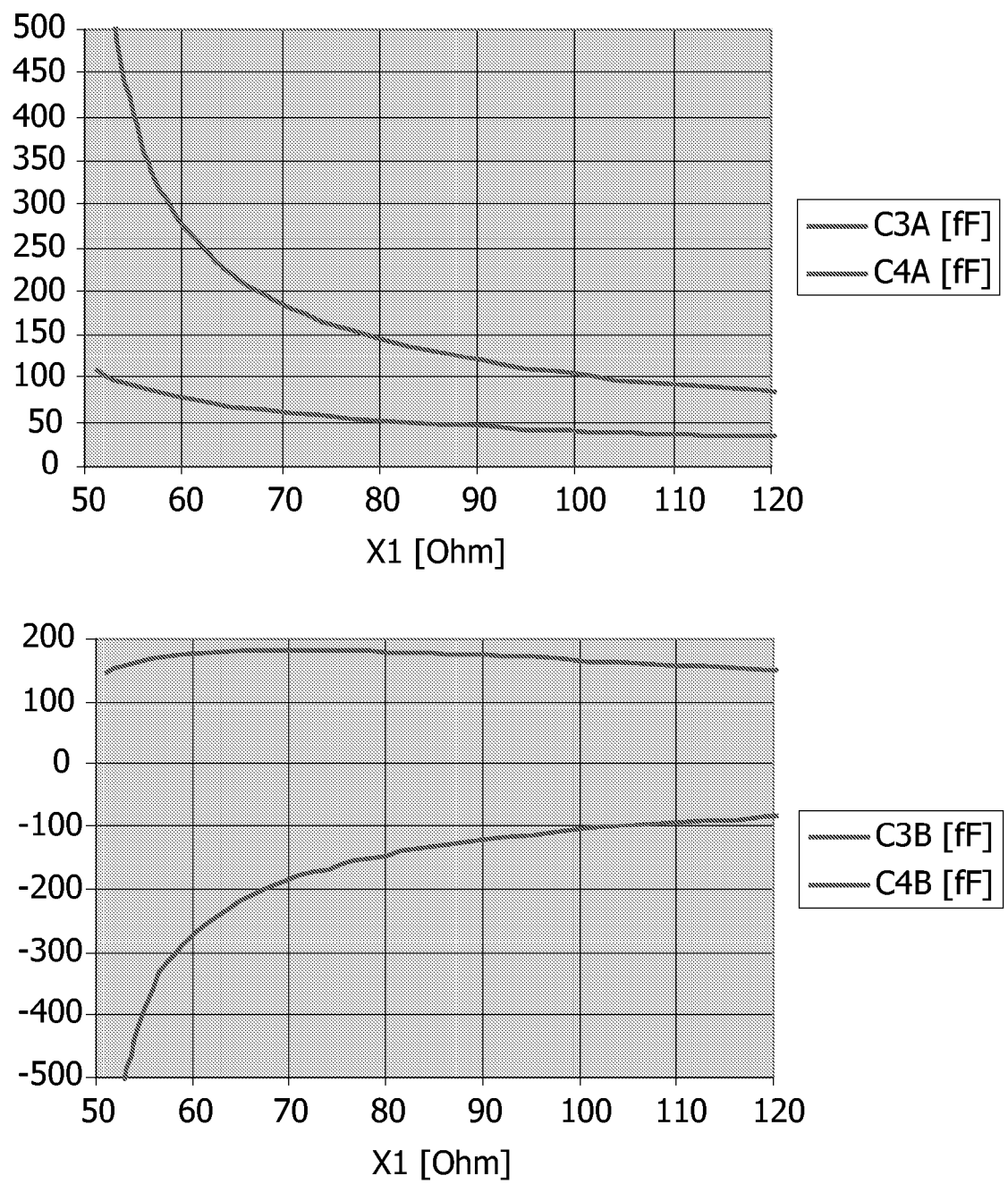
FIG. 4 shows capacitor values of the capacitors of the amplifier shown in FIG. 3 as a function of an imaginary part of an input impedance of the amplifier.

The capacitor values of the first and second capacitors 45 and 46 of the amplifier 31-34 are shown in FIG. 4 as a function of an imaginary part X1 of an input impedance of the amplifier 31-34. This input impedance is defined as the impedance present when entering or looking into the control electrodes of the first transistor 31 and the second transistor 32. First capacitor values C3A and C4A of the first and second capacitors 45 and 46 are shown in the upper graph of FIG. 4, and second capacitor values C3B and C4B of the first and second capacitors 45 and 46 are shown in the lower graph of FIG. 4. Obviously, in both cases there is a fixed relationship between the first and second capacitor values and the imaginary part of the input impedance of the amplifier 31-34. The solutions shown in the upper graph are to be preferred, owing to the fact that the solutions shown in the lower graph require the second capacitor 46 to have a negative value. A capacitor having a negative value is to be realized by means of an inductor, which requires more chip area.

By taking the low noise amplifier 10 and the inductor 8 from FIG. 1, an impedance model can be made. According to this impedance model, the port 11a is coupled via a serial circuit of a first impedance having a value $Z_1$ and a second impedance having a value $Z_1$ to the port 11b. A common point of this serial circuit is coupled via a third impedance having a value $Z_2$ to ground, and the port 11b is coupled via a fourth impedance having a value $Z_3$ to ground. Through the respective first and second and third impedances having a value $Z_1$ and having a value $Z_1$ and having a value $Z_2$, the respective currents $I_1$ and $I_3$ and $I_2$ are flowing, such that $I_1=I_2+I_3$. At the respective ports 11a and 11b, the respective voltages $+V_1$ and $-V_1$ are assumed to be present. In this case, a differential input impedance will be $Z_{\mathit{diff}}=2Z_1$, and a common mode input impedance will be $Z_{cm}=0.5\ Z_1+Z_2$.

Then it can be calculated that for example $Z_1=-2Z_2$. So, the common mode input impedance for the low noise amplifier 10 including the inductor 8 must be equal to zero. By substituting $Z_2=-0.5\ Z_1$ into the impedance model, by simulating the antenna 4 through a fifth impedance having a value $Z_4$ coupled to the port 11a, by defining a sixth impedance having a value $Z_5$ present when looking from the first impedance having the value $Z_1$ to the common point, by defining a seventh impedance having a value $Z_6$ present when looking from the port 11a to the first impedance having the value $Z_1$, by converting each value of each impedance through $Z=R+jX$, and by defining the proper targets to be realized, equations can be calculated. Simulations based on these equations result in the graphs shown in FIG. 4 and confirm the fact that the coupling factor k for the differential inductor 41,42 must fulfill $0.5 \leq k \leq 1.0$. At 24 GHz, a noise figure under 4 dB can be reached.

Although bipolar NPN transistors have been used, other kinds of transistors such as bipolar PNP and FETs etc. might be used as well, for one or more of the transistors shown. Other means than the first element in the form of the differential inductor with a center tap and comprising the coupling factor k ($0.5 \leq k \leq 1.0$) for reducing a common mode input impedance of the amplifier are not to be excluded, such as for example circuits for simulating the differential inductor with a center tap and comprising the coupling factor k ($0.5 \leq k \leq 1.0$) and equivalent circuits.

It should be noted that the above-mentioned embodiments illustrate rather than limit the invention, and that those skilled in the art will be able to design many alternative embodiments without departing from the scope of the appended claims as the European patent application 05100912.4 filed on the same date as the present application. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the receiver claim enumerating several means, several of these means may be embodied by one and the same item of hardware. The mere fact that certain measures are recited in mutually different dependent claims does not indicate that a combination of these measures cannot be used to advantage.

The invention claimed is:

1. A receiver comprising an amplifier for amplifying an antenna signal, which amplifier comprises:
   an amplifier input and an amplifier output,
   the amplifier input being a single ended input for receiving the antenna signal,
   the amplifier output being a differential output,
   the amplifier further comprising a first transistor and a second transistor, control electrodes of both transistors being coupled to each other via a first element, and
   said first element comprising a circuit for reducing a common mode input impedance of the amplifier.

2. The receiver according to claim 1, wherein first main electrodes of both transistors are coupled to each other via a second element.

3. The receiver according to claim 2, the first element comprising a differential inductor with a center tap and having a coupling factor k, with $0.5<k<1.0$.

4. The receiver according to claim 3, the center tap being coupled to a voltage source.

5. The receiver according to claim 2, second main electrodes of both transistors being coupled to a cascade circuit comprising the amplifier output.

6. The receiver according to claim 2, a control electrode of the first transistor being coupled via a first capacitor to the amplifier input, and a control electrode of the second transistor being coupled via a second capacitor to ground.

7. The receiver according to claim 6, both capacitors having different values.

8. Amplifier for amplifying an antenna signal in a receiver, which amplifier comprises:
   an amplifier input and an amplifier output,
   the amplifier input being a single ended input for receiving the antenna signal,
   the amplifier output being a differential output,
   the amplifier further comprising a first transistor and a second transistor, control electrodes of both transistors being coupled to each other via a first element, and
   said first element comprising a circuit for reducing a common mode input impedance of the amplifier.

9. The receiver according to claim 1 wherein the circuit for reducing a common mode input impedance of the amplifier comprises a circuit simulating a differential inductor with a center tap.

10. The amplifier according to claim 8, wherein first main electrodes of both transistors are coupled to each other via a second element.

11. The amplifier according to claim 10, the first element comprising a differential inductor with a center tap and having a coupling factor k, with $0.5<k<1.0$.

12. The amplifier according to claim 11, the center tap being coupled to a voltage source.

13. The amplifier according to claim 10, second main electrodes of both transistors being coupled to a cascade circuit comprising the amplifier output.

14. The amplifier according to claim 10, a control electrode of the first transistor being coupled via a first capacitor to the amplifier input, and a control electrode of the second transistor being coupled via a second capacitor to ground.

15. The amplifier according to claim 14, both capacitors having different values.

16. The amplifier according to claim 8 wherein the circuit for reducing a common mode input impedance of the amplifier comprises a circuit simulating a differential inductor with a center tap.

* * * * *